(12) United States Patent
Miller et al.

(10) Patent No.: US 7,307,433 B2
(45) Date of Patent: Dec. 11, 2007

(54) INTELLIGENT PROBE CARD ARCHITECTURE

(75) Inventors: Charles A. Miller, Fremont, CA (US); Matthew E. Chraft, Copperopolis, CA (US); Roy J. Henson, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 156 days.

(21) Appl. No.: 10/828,755

(22) Filed: Apr. 21, 2004

(65) Prior Publication Data

US 2005/0237073 A1   Oct. 27, 2005

(51) Int. Cl.
*G01R 31/02* (2006.01)
*G01R 31/06* (2006.01)

(52) U.S. Cl. ...................... 324/754; 324/765

(58) Field of Classification Search ................ 324/754, 324/765, 758, 158.1, 72.5; 438/14, 17, 18; 714/719, 720; 439/482, 700
See application file for complete search history.

(56) References Cited

U.S. PATENT DOCUMENTS

| | | | | |
|---|---|---|---|---|
| 4,658,209 A * | 4/1987 | Page | ........................... | 714/46 |
| 5,091,692 A * | 2/1992 | Ohno et al. | ................... | 324/758 |
| 5,550,480 A * | 8/1996 | Nelson et al. | .............. | 324/754 |
| 5,875,198 A * | 2/1999 | Satoh | .......................... | 714/740 |
| 5,996,102 A * | 11/1999 | Haulin | ........................ | 714/740 |
| 6,351,134 B2 * | 2/2002 | Leas et al. | ................... | 324/765 |
| 6,380,753 B1 * | 4/2002 | Iino et al. | .................... | 324/765 |
| 6,400,173 B1 * | 6/2002 | Shimizu et al. | ............. | 324/765 |
| 6,603,323 B1 | 8/2003 | Miller | ......................... | 324/754 |
| 6,798,225 B2 * | 9/2004 | Miller | ......................... | 324/754 |
| 6,856,150 B2 * | 2/2005 | Sporck et al. | .............. | 324/754 |
| 2002/0105352 A1 * | 8/2002 | Mori et al. | ................. | 324/765 |
| 2002/0145437 A1 * | 10/2002 | Sporck et al. | .............. | 324/754 |
| 2003/0074611 A1 * | 4/2003 | Nachumovsky | ............. | 714/718 |
| 2003/0115517 A1 * | 6/2003 | Rutten | ........................ | 714/718 |
| 2003/0210069 A1 * | 11/2003 | Kikuchi et al. | ............. | 324/765 |
| 2004/0008024 A1 * | 1/2004 | Miller | ..................... | 324/158.1 |
| 2004/0075453 A1 * | 4/2004 | Slupsky | ...................... | 324/750 |

OTHER PUBLICATIONS

U.S. Appl. No. 10/693,133, filed Oct. 23, 2003, Charles A. Miller.

* cited by examiner

*Primary Examiner*—Paresh Patel
(74) *Attorney, Agent, or Firm*—N. Kenneth Burraston (57) ABSTRACT

A probe card for a wafer test system is provided with a number of on board features enabling fan out of a test system controller channel to test multiple DUTs on a wafer, while limiting undesirable effects of fan out on test results. On board features of the probe card include one or more of the following: (a) DUT signal isolation provided by placing resistors in series with each DUT input to isolate failed DUTs; (b) DUT power isolation provided by switches, current limiters, or regulators in series with each DUT power pin to isolate the power supply from failed DUTs; (c) self test provided using an on board micro-controller or FPGA; (d) stacked daughter cards provided as part of the probe card to accommodate the additional on board test circuitry; and (e) use of a interface bus between a base PCB and daughter cards of the probe card, or the test system controller to minimize the number of interface wires between the base PCB and daughter cards or between the base PCB and the test system controller.

5 Claims, 5 Drawing Sheets

INTELLIGENT PROBE CARD ARCHITECTURE

BACKGROUND

1. Technical Field

The present invention relates to a probe card configuration for a test system used to test integrated circuits (ICs) on a wafer. More particularly, the present invention relates to a probe card configuration with intelligent on board features that can, for example, enable the probe card to distribute a single channel from a test system controller to multiple test probes to connect to the ICs on a wafer.

2. Related Art

When testing ICs on a wafer, it is cost effective to test as many devices as possible in parallel, thus reducing the test time per wafer. Test system controllers have evolved to increase the number of channels and hence the number of devices that can be tested in parallel. However, a test system controller with increased test channels is a significant cost factor for a test system, as is a probe card with complex routing lines used to accommodate multiple parallel test channels. It is, thus, desirable to provide an overall probe card architecture that allows increased test parallelism without requiring increased test system controller channels and without increased probe card routing complexity.

With limited test system controller resources, fanning out a signal from a test system controller in the probe card to multiple transmission lines may be desirable, since the increased cost of probe card routing complexity will typically be outweighed by the cost of a new test system controller. A test system controller has resources to enable testing a fixed number of Devices Under Test (DUTs) on a wafer. With advancing technology, more DUTs are fabricated on a single wafer. To avoid the cost of a new test system controller, either multiple touchdowns of a test system to the wafer are performed, or the test signals normally provided to a single DUT are fanned out to multiple DUTs in the probe card. The later may be more desirable for burn in testing where during heating of the wafer, multiple touch downs of the probe card to the wafer is sometimes impractical. Further, less touch downs to the wafer decrease the likelihood of damaging the wafer, and less touch downs limit wear on the probes in the test system, which may be expensive to replace.

Fan out of the test signals in a probe card between a test system controller and DUTs, however, not only increases the complexity of a system, but also can cause inaccurate test results. To better assure test integrity, increased circuitry can be provided on the probe card to minimize the effect of a fault on one of the fan out lines. With a test system having probe card fan out, a fault (short circuit) in a component connected on a fanned out line will severely attenuate the test signal for all devices on the fanned out test system channels. U.S. Pat. No. 6,603,323 entitled "Closed-Grid Bus Architecture For Wafer Interconnect Structure," incorporated herein by reference, describes a solution by providing isolation resistors between the channel line branch points and probes to reduce attenuation caused by the faulty component. A further solution is provided in U.S. patent application Ser. No. 10/693,133, incorporated herein by reference, entitled "Isolation Buffers With Controlled Equal Time Delays" describing a system where isolation buffers are used between channel line branch points and probes, with circuitry included to assure the isolation buffers each provide a uniform delay. Other problems, however, may occur with the added circuitry affecting test integrity, as recognized in development of the present invention.

With the cost of test system controller systems making their long term retention desirable, probe cards are desirable that can further take on expanded test system functions to increase the lifecycle of an outdated test system. Probe cards, serving as an interface between a test system controller and a wafer, are typically much less expensive than a test system controller, and typically replaced after a much shorter lifecycle than the test system controller due to wear of probes on the probe card.

Figure 1:
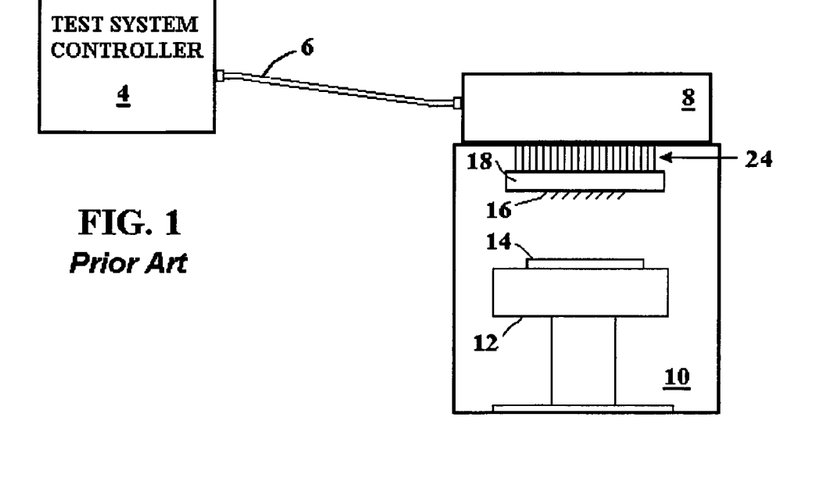
FIG. 1 shows a block diagram of components of a conventional wafer test system.

FIG. 1 shows a block diagram of a test system using a probe card for testing DUTs on a semiconductor wafer. The test system includes a test system controller 4, or general purpose computer, connected by a communication cable 6 to a test head 8. The test system further includes a prober 10 made up of a stage 12 for mounting a wafer 14 being tested, the stage 12 being movable to contact the wafer 14 with probes 16 on a probe card 18. The prober 10 includes the probe card 18 supporting probes 16 which contact DUTs formed on the wafer 14.

In the test system, test data is generated by the test system controller 4 and transmitted through the communication cable 6, test head 8, probe card 18, probes 16 and ultimately to DUTs on the wafer 14. Test results are then provided from DUTs on the wafer back through the probe card 18 to the test head 8 for transmission back to the test system controller 4. Once testing is complete, the wafer is diced up to separate the DUTs.

Test data provided from the test system controller 4 is divided into the individual test channels provided through the cable 6 and separated in the test head 8 so that each channel is carried to a separate one of the probes 16. The channels from the test head 8 are linked by flexible cable connectors 24 to the probe card 18. The probe card 18 then links each channel to a separate one of the probes 16.

Figure 2:
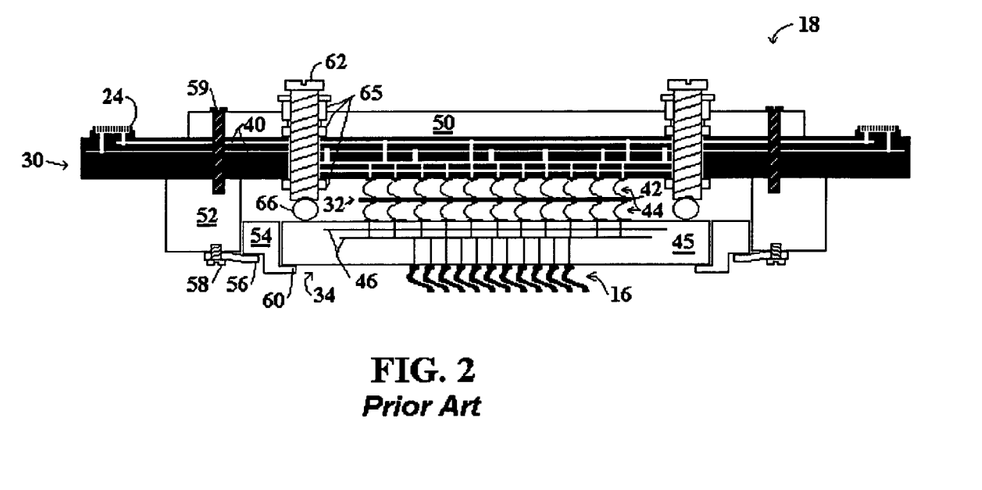
FIG. 2 is a cross sectional view of a conventional probe card for the wafer test system of FIG. 1.

FIG. 2 shows a cross sectional view of components of a typical probe card 18. The probe card 18 is configured to provide both electrical pathways and mechanical support for the spring probes 16 that will directly contact the wafer. The probe card electrical pathways are provided through a printed circuit board (PCB) 30, an interposer 32, and a space transformer 34. Test data from the test head 8 is provided through flexible cable connectors 24 typically connected around the periphery of the PCB 30. Channel transmission lines 40 distribute signals from the connectors 24 horizontally in the PCB 30 to contact pads on the PCB 30 to match the routing pitch of pads on the space transformer 34. The interposer 32 includes a substrate 42 with spring probe electrical contacts 44 disposed on both sides. The interposer 32 electrically connects individual pads on the PCB 30 to pads forming a land grid array (LGA) on the space transformer 34. Traces 46 in a substrate 45 of the space transformer 34 distribute or "space transform" connections from the LGA to spring probes 16 configured in an array. The space transformer substrate 45 is typically constructed from either multi-layered ceramic or organic based laminates. The space transformer substrate 45 with embedded circuitry, probes and LGA is referred to as a probe head.

Mechanical support for the electrical components is provided by a back plate 50, bracket (Probe Head Bracket) 52, frame (Probe Head Stiffener Frame) 54, leaf springs 56, and leveling pins 62. The back plate 50 is provided on one side of the PCB 30, while the bracket 52 is provided on the other side and attached by screws 59. The leaf springs 56 are attached by screws 58 to the bracket 52. The leaf springs 56 extend to movably hold the frame 54 within the interior walls of the bracket 52. The frame 54 then includes horizontal extensions 60 for supporting the space transformer 34 within its interior walls. The frame 54 surrounds the probe head and maintains a close tolerance to the bracket 52 such that lateral motion is limited.

Leveling pins 62 complete the mechanical support for the electrical elements and provide for leveling of the space transformer 34. The leveling pins 62 are adjusted so that brass spheres 66 provide a point contact with the space transformer 34. The spheres 66 contact outside the periphery of the LGA of the space transformer 34 to maintain isolation from electrical components. Leveling of the substrate is accomplished by precise adjustment of these spheres through the use of advancing screws, or leveling pins 62. The leveling pins 62 are screwed through supports 65 in the back plate 50 and PCB 30. Motion of the leveling pin screws 62 is opposed by leaf springs 56 so that spheres 66 are kept in contact with the space transformer 34.

Figure 3:
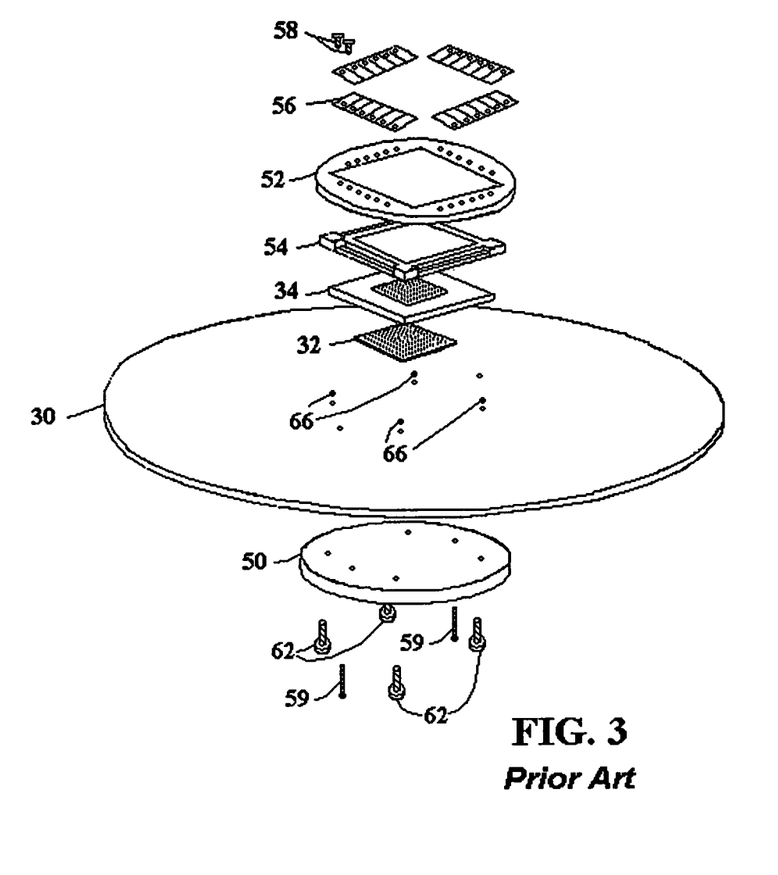
FIG. 3 is an exploded assembly view of components of the probe card of FIG. 2.

FIG. 3 shows an exploded assembly view of components of the probe card of FIG. 2. FIG. 3 shows attachment of the back plate 50, PCB 30, and bracket 52 using two screws 59. Four leveling screws 62, are provided through the back plate 50 and PCB 30 to contact four spheres 66 near the corners of the space transformer substrate 34. The frame 54 is provided directly over the space transformer substrate 34, the frame 54 fitting inside the bracket 52. The leaf springs 56 are attached by screws 58 to the bracket 52. Two screws 58 are shown for reference, although additional screws 58 (not shown) are provided around the entire periphery to attach the leaf springs.

Figure 4:
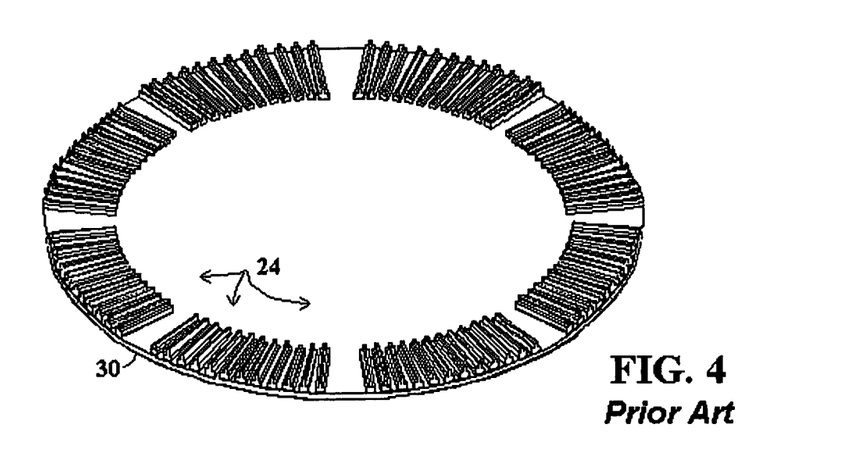
FIG. 4 is a perspective view of the PCB of FIG. 2 showing connectors for connecting to a test head.

FIG. 4 shows a perspective view of the opposing side of PCB 30 illustrating the arrangement of connectors 24 around its periphery. In FIG. 3, the connectors 24 of the PCB 30 are facing down and not shown. In typical probe cards, the connectors 24 (typically zero insertion force (ZIF) connectors) provide flexible cable connections located around the periphery of the probe card, and are configured to mate with connectors that are typically arranged in a similar fashion on the test head. Although illustrated as ZIF connectors, other connector types may be used, such as pogo pins, non-ZIF flexible cable connectors, conductive elastomer bumps, stamped and formed spring elements, etc.

SUMMARY

In accordance with the present invention, a probe card is provided with a number of on board features enabling fan out of a test channel signal to multiple DUTs while limiting undesirable effects of fan out on test results. The on board probe card features further enable enhancing test system controller functions, effectively increasing the lifecycle of some test system controllers, providing more advanced functions without the cost of purchasing a more modern test system controller. The probe card in accordance with the present invention enables significant fan out with test integrity so that probe cards can be used with a limited channel test system controller to test a wafer with one touch down, a particularly desirable feature during burn in tests.

On board features of the probe card include one or more of the following: (a) DUT signal isolation provided by placing resistors in series with each DUT input to isolate failed DUTs, as described generally in U.S. Pat. No. 6,603,323 reference previously; (b) DUT power isolation provided by switches, current limiters, or regulators in series with each DUT power pin to isolate the power supply from failed DUTs, allowing a single test system controller power supply to power multiple DUTs; (c) self test provided using an on board micro-controller or FPGA and associated multiplexers and D/A converters, on board self testing being necessary with fanned out test system controller resources since test system controller integrity checks may no longer be valid; (d) stacked or vertically oriented daughter cards provided between test system controller connections which form an outline area on the PCB of the probe card, the stacked daughter cards to accommodate additional circuitry used in accordance with the present invention, and to provide the additional circuitry in close proximity to the PCB, space transformer and other components originally forming the probe card; and (e) use of a communications bus between a controller provided on the base PCB and separate daughter cards and the test system controller to minimize the number of interface wires between the base PCB and the daughter cards or between the base PCB and the test system controller. The bus can further be configured to distribute analog signals to the DUTs through the use of serial to parallel D/A or A/D converters on the probe card, providing for minimum wiring and minimum use of PCB area.

BRIEF DESCRIPTION OF THE DRAWINGS

Further details of the present invention are explained with the help of the attached drawings in which.

DETAILED DESCRIPTION

Figure 5:
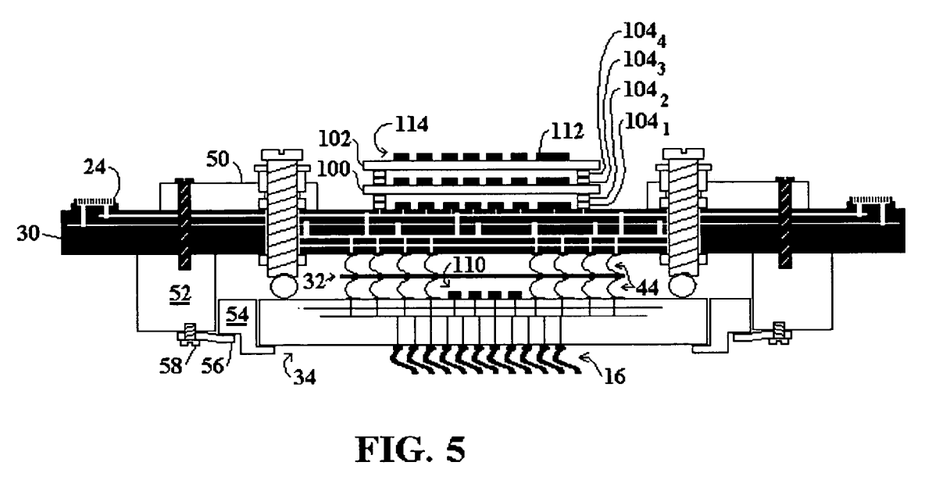
FIG. 5 shows a cross sectional view of a probe card with on board components in accordance with the present invention.

FIG. 5 shows a cross sectional view of a probe card, modified from the probe card configuration shown in FIG. 2 to include on board components, in accordance with the present invention, including daughter cards 100 and 102. For convenience, components carried over from FIG. 2 to FIG. 5 are similarly labeled. The daughter cards are shown in FIG. 5 as connected by stacked connectors $104_{1-4}$. The stacked connectors are attached to opposing card surfaces, and include male and female mating connectors. For example connector $104_1$ is connected to the base PCB 30, while connector $104_2$ is connected to daughter card 100. The stacked connectors can be ZIF, pogo pin, or other type connectors suitable for interconnecting printed circuit boards. The connectors make the daughter cards removable so that different daughter cards can be easily installed, depending on the test environment. Although shown with removable connectors, in one embodiment, the daughter cards can be rigidly connected, such as by soldering. Further, although two daughter cards are shown, a single card or more than two cards can be used, depending on design requirements.

As illustrated, the daughter cards 100 and 102 are provided in available spacing between test system controller interface connectors 24. The test system controller could be a conventional Automatic Test Equipment (ATE) tester or a computer system used to control and configure the probe card, which can limit the height above the connectors 24 which the daughter cards can be stacked. In the configuration shown, an opening is provided in the back plate 50, forming an outline area where the daughter cards 100 and 102 are connected to the base PCB 30. The area of the probe card available for daughter cards is generally dictated by the test system controller connection and prober constraints. With limited horizontal spacing between test system controller interface connectors 24, board area to accommodate additional circuitry for the architecture in accordance with the present invention is obtained by stacking additional daughter cards within the outline area of the probe card.

The stacked connectors $104_{1-4}$ provide spacing for discrete components 114 provided on the surface of each of the base PCB 30 and daughter cards 100 and 102. The discrete components 114 can include bypass capacitors for power supply lines. In one embodiment, similar discrete components 112 are also provided on a surface of the space transformer 34. In one embodiment, the discrete components 112 are decoupling capacitors. To accommodate the discrete components 112, a number of spring contacts 44 are removed from the interposer 32, and rerouting of lines is provided in the space transformer 34. With the discrete components 112 being decoupling capacitors they are placed in close proximity to lines carrying power to probes 16 to maximize capacitance on the power lines that affect test results. By being placed in close proximity to where capacitance will improve the decoupling, smaller capacitances can be used for the capacitors.

The daughter cards, such as 100 and 102 shown, may be redundant with the base PCB 30, in that they carry the same discrete components on their surface. More redundant daughter cards can be simply added if more fan out of test channels is desired. Alternatively, the daughter cards can include differing components depending on test requirements and available space.

The daughter card 102 is shown to include a micro-controller 110 as a discrete component 114. Although shown on daughter card 102, similar micro-controllers can be provided on one or more of the daughter card 102, daughter card 100, base PCB 30, and space transformer 34. The micro-controller 110 may be any of a variety of programmable controllers including a microprocessor, digital signal processor, sequencer, Field Programmable Gate Array (FPGA), Programmable Logic Device (PLD) or other controller or device that can be programmed/configured as a controller for generating and providing test or control signals to electrical circuits. In one embodiment, the micro-controller 110 is the Microchip PIC18FXX20 with A/D capability.

The discrete components 114 on a daughter card or base PCB 30, or 112 on the space transformer can include memory for use by the micro-controller 110, or by another processor either on the probe card, or external to the probe card. The memory can be a random access memory (RAM) providing temporary storage, or a device providing more permanent storage such as a flash memory. To enable the micro-controller 110, or other processor to perform testing, the memory can be programmed to include test vectors or a test program. Similarly, the memory can include system configuration data.

The circuitry can also be organized such that, in concert with the DUT, a full system is created for evaluating the DUT. For example, the daughter card and probe card circuitry could include support circuits for a personal computer motherboard if the DUT is an Intel or other microprocessor. On power up, the DUT will experience an electrical environment like the final use environment. In this way, a test of operating correctness can be performed on unpackaged DUT devices.

To accommodate the micro-controller 110 and memory, or other discrete components which can generate a significant amount of heat, a temperature control system can be included along with the discrete components 114 on the probe card daughter cards 100 and 102, or on the base PCB 30. The temperature control system can include temperature sensors, along with heat sinks, fans, electric coolers, heaters, or other devices needed to maintain component temperatures within a desired range.

Discrete components 114 in addition to the micro-controller 110 and memory can, for example, include voltage regulators, relays, multiplexers, switches, D/A converters, A/D converters, shift registers, etc. Examples for the configuration of the discrete components are shown in the circuit diagrams of FIG. 6 and FIG. 7. Further details of these components, as well as other features included on the probe card in accordance with the present invention are described below.

A. DUT Signal Isolation

Figure 6:
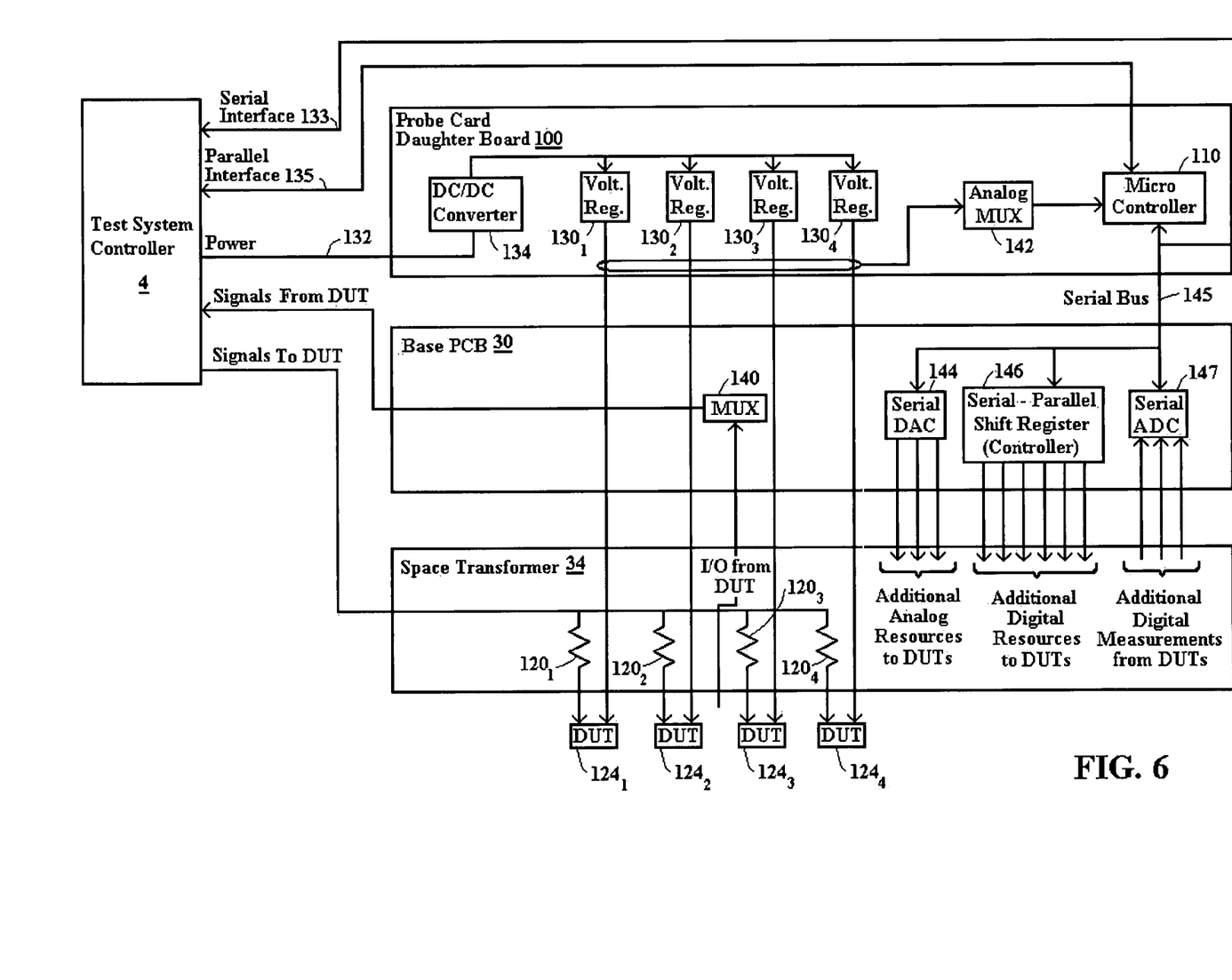
FIG. 6 shows a circuit diagram for components of the probe card of FIG. 5.

In one embodiment the space transformer 34 includes thin film resistors placed in series with each probe that provides a DUT input. Such thin film resistors $120_{1-4}$, providing signals from a single channel of test system controller 4 to inputs of DUTs $124_{1-4}$ are illustrated in FIG. 6. As described previously, the architecture in accordance with the present invention uses embedded resistors, such as resistors $120_{1-4}$, in the space transformer 34 placed in series with each DUT input to isolate failed or shorted DUTs from good DUT inputs. The space transformer 34, illustrated in FIG. 5, is typically a multi-layer ceramic substrate, or may be made up of a multi-layer organic substrate, with the thin film resistors $120_{1-4}$ provided on one or more layers in the path of routing lines to the probes. Use of such DUT isolation resistors is described in U.S. Pat. No. 6,603,323, reference previously. In one embodiment, resistors have values ranging between 50 and 5000 ohms each. Values on the order of 1000 ohms allow a single DUT channel to drive 10 to 100 DUTs at frequencies between 5 and 50 MHz. Placement of the embedded resistors close to the DUT is key to enabling maximum performance while at the same time not increasing the size of the probe head. Discrete or surface mounted resistors could also be used for this DUT isolation application.

In a further embodiment, as an alternative to series resistors, buffers are placed in series with each DUT input to isolate failed DUTs, as described in U.S. patent application Ser. No. 10/693,133. Circuitry is then included on a the base PCB or daughter card to assure the delay provided in each line having a buffer is uniform, as described in the application Ser. No. 10/693,133.

B. DUT Power Isolation and Power Control

The system might be limited in the number of DUT power supplies it has available. When using a single power supply to drive multiple DUTs, it is desirable to isolate failed or shorted DUTs from affecting the other good devices connected to the same test system controller power supply. It is further desirable to control the power provided since a reduction of power can occur with each channel branch added.

The present architecture uses voltage regulators, current limiters or switches in series with each DUT power pin to isolate failed DUTs. Use of voltage regulators $130_{1-4}$ from a power supply channel 132 of the test system controller 4 is illustrated in FIG. 6. Although shown provided from the test system controller 4, power can likewise be provided from separate power supplies. The voltage regulators $130_{1-4}$ have power supplied from the test system controller power supply line 132, and distribute the signal power line to power multiple DUTs $124_{1-4}$. The voltage regulators $130_{1-4}$ function to isolate failed DUTs from the good DUTs operating from the same voltage source by detecting current surges caused by a DUT with a short, or similar fault, and then cutting off or minimizing current to the DUT. Although shown as a voltage regulator in FIG. 6, the voltage regulators $130_{1-4}$ can be replaced by switches or current limiters with similar feedback enabling isolation of a failed DUT.

In addition to power supply isolation, the present architecture provides for increasing power from a DUT power supply channel to enable a single power supply to drive more DUTs. To increase power, a DC/DC converter 134 is provided on daughter card 100 between the test system controller 4 and the DUT voltage regulators $130_{1-4}$ to provide additional DUT power. The test system controller power supplies generally have a programmable voltage output with a fixed maximum current. Many new silicon devices operate at lower voltages. Hence, the test system controller can be programmed to a higher voltage and the DC/DC converter 134 can regulate down to a lower voltage and higher current enabling the test system controller power supply to drive more DUTs.

To assure a precise voltage is provided to the test system, an embodiment of the present invention provides for calibration and monitoring of the voltage regulators $130_{1-4}$, as well as other probe card components. The micro-controller 110 is shown connected to monitor the output of voltage regulators voltage regulators $130_{1-4}$ to determine when current is cut off due to a DUT failure. In addition to receiving a current signal, the micro-controller 110, or other processor or discrete components of the probe card can be configured to calibrate the voltage regulators $130_{1-4}$ to enable accurate control of the voltage provided from the regulators. Control signals can then be provided from the micro-controller 110, or other component to control the voltage output through the regulators $130_{1-4}$.

C. Probe Card Self Test

As parallelism for testing is provided by fan out in the probe card and test functionality is moved onto the probe card, it becomes desirable to include features on the probe card to insure probe card test function integrity without requiring additional test system controller functionality. In a conventional probe card, the test system controller can generally monitor each channel for integrity. When test system controller resources are distributed among several DUTs and components are added to isolate DUTs, probe card integrity checks made by the test system controller may no longer be valid checks of the test system.

Accordingly, in one embodiment shown in FIG. 6 the present architecture performs self testing of a combination of the micro-controller 110, serial-parallel register (controller) 146, multiplexers 140 and 142, D/A converter 144, A/D converter 147 and other circuit components used to assure integrity of the test functions added to the probe card. The modes of operation performed with the micro-controller 110, or processing units on other daughter cards or the base PCB 30 provide for self test allowing the individual daughter card PCB assemblies and base PCB assembly to be tested.

The probe card can be configured, or include software in memory to provide for self-testing. Test results are reported from the probe card to the test system controller 4, or other user interface. The micro-controller 110, or other processor, can also include a programmable mode allowing the probe card to be reconfigured to allow probe card testing using standard probe card test metrology tools. One example of a standard metrology tool which may be used is the probeWoRx system manufactured by Applied Precision Inc. Use of a probe card with such programmable modes allows self test to be performed in the wafer production test environment.

Apart from a self test mode, the micro-controller 110, or other processor of the probe card can include a mode to monitor and report the "health" or performance of the probe card in real time. As one example, the micro-controller 110 is shown receiving the output of voltage regulators $130_{1-4}$, illustrating its "health" reporting function if a DUT has failed. Circuitry on the probe card to provide for calibration of the regulators $130_{1-4}$, as well as other components of the probe card, can further assure the accuracy of "health" monitoring. The micro-controller 110, or other circuitry on the probe card can likewise be connected to monitor the "health" of DUTs, or to assure the base PCB and daughter card components are functioning properly and report results to the test system controller 4, or other user interface.

In addition to self-test and real time "health" monitoring, the micro-controller 110, or other processor of the probe card can provide for event logging. Events logged can, for example, include a test history, wafer statistics, pass/fail statistics, DUT site/pin failures, or other data desired when testing using the probe card. Memory included on the probe card can be used to store the event log data.

D. Serial Bus Interface

To minimize the amount of routing lines and connector resources needed with use of the daughter cards, a serial bus 145 is provided with the present architecture. The micro-controller 110 in FIG. 6 provides a serial bus interface in one embodiment to control the serial bus 145 without additional area overhead. The serial bus 145 of the probe card allows for distribution of the probe card built in self test (BIST) features with a minimum number of interface wires. The serial bus is a key enabler of the probe card BIST functionality.

The serial interface bus 145 is provided between the daughter card 100 (and other daughter cards if used) and base PCB 30. The serial bus enables communication between the base PCB 30 and daughter cards with a minimum number of connector and wiring resources. The serial to parallel converter, such as serial-parallel shift register 146 is provided on the base PCB 30 for distributing the serial bus signals to individual DUTs internal to the PCB 30 with a minimum amount of routing lines and connector resources.

Although shown as a simple serial-parallel shift register, the serial-parallel shifting device 146 may be a programmable controller such as a processor, DSP, FPGA, PLD, or micro-controller providing similar functionality to the micro-controller 110 on daughter card 100, with a basic function of providing parallel to serial conversion. As a processor, the unit 146 can also be configured to perform self test functions, serve to provide programming or data to other processors on the daughter cards, and serve to provide a daisy chained connection of processors through the serial bus 145.

As a processor, the serial/parallel controller unit 146 can further utilize compressed data formats, and can function to compress and decompress data and test vectors. For example, the serial/parallel controller unit 146 can be configured to receive BCD data from components not attached to the serial bus and convert the BCD data to serial data for subsequent distribution. Similar data compression and decompression can be provided by other programmable controllers or processors included on one of the daughter cards 100 and 102 or base PCB 30 of the probe card.

Similarly, the serial/parallel controller unit 146 configured as a processor can enable the probe card to support scan test features of the DUT. Programmable logic and memory chips can have a serial scan port to provide for scan testing. The scan port is typically used in manufacturing to provide for a built in self test (BIST) of the chip, with the scan port not later being connected to a package lead after manufacture. With a connection of a DUT scan port to the serial/parallel controller unit, or other scan test circuitry attached to the serial bus, scan test features of the DUT can be enabled by the daughter card either in conjunction with or separate from the test system controller 4.

The serial bus interface 133 to the test system controller 4 is further shown in FIG. 6, providing for serial communication from the test system controller 4 with a minimal number of wiring and connector resources. With the serial interface 133, the test system controller 4 can route control signals to the serial to parallel converter 146, or to the micro-controller 110. The serial interface 133 can be provided from the JTAG serial port of the test system controller 4 in one embodiment, with a scan register of the test system controller 4 used to provided serial control signals from the test system controller 4.

Although the test system controller 4 is shown to have a serial interface 133 connection with the micro-controller 110, other type communication interfaces can be provided, such as the parallel interface 135 shown. The additional interfaces can be used either in combination with the serial interface, or alone. Other types of interfaces can include RF, wireless, network, IR, or various connections as the test system controller 4 may have available. Although shown connected only to the micro-controller 110, interface 135 can be connected to other devices on the probe card either directly or over a bus.

The serial bus 145 can also be used to distribute analog signals to and from the DUTs. The present architecture includes a serial digital to analog converter 144 to convert serial signals to analog form and distribute the signals to multiple DUTs. The D/A converter 144 receives a test signal input through the serial bus 145 from the serial-parallel shift register 146, although the signal could be provided from other components connected to the serial bus 145. The D/A converter 144 can contain multiple D/A converters per package (typically 8, 16 or 32 per package) that are connected to the serial interface bus 145 for delivering analog voltages to the DUTs with a minimum wiring and PCB area. An A/D converter 147 is further included to receive analog signals from the DUTs and convert to a digital form to provide signals over the serial bus, preferably to the serial-parallel shift register. An analog multiplexer 142 is further provided to provide feedback from the outputs of the voltage regulators $130_{1-4}$ to the micro-controller 110 to enable the micro-controller to assure the voltage regulators $130_{1-4}$ are functioning properly for both self test, and test integrity assurance.

Figure 7:
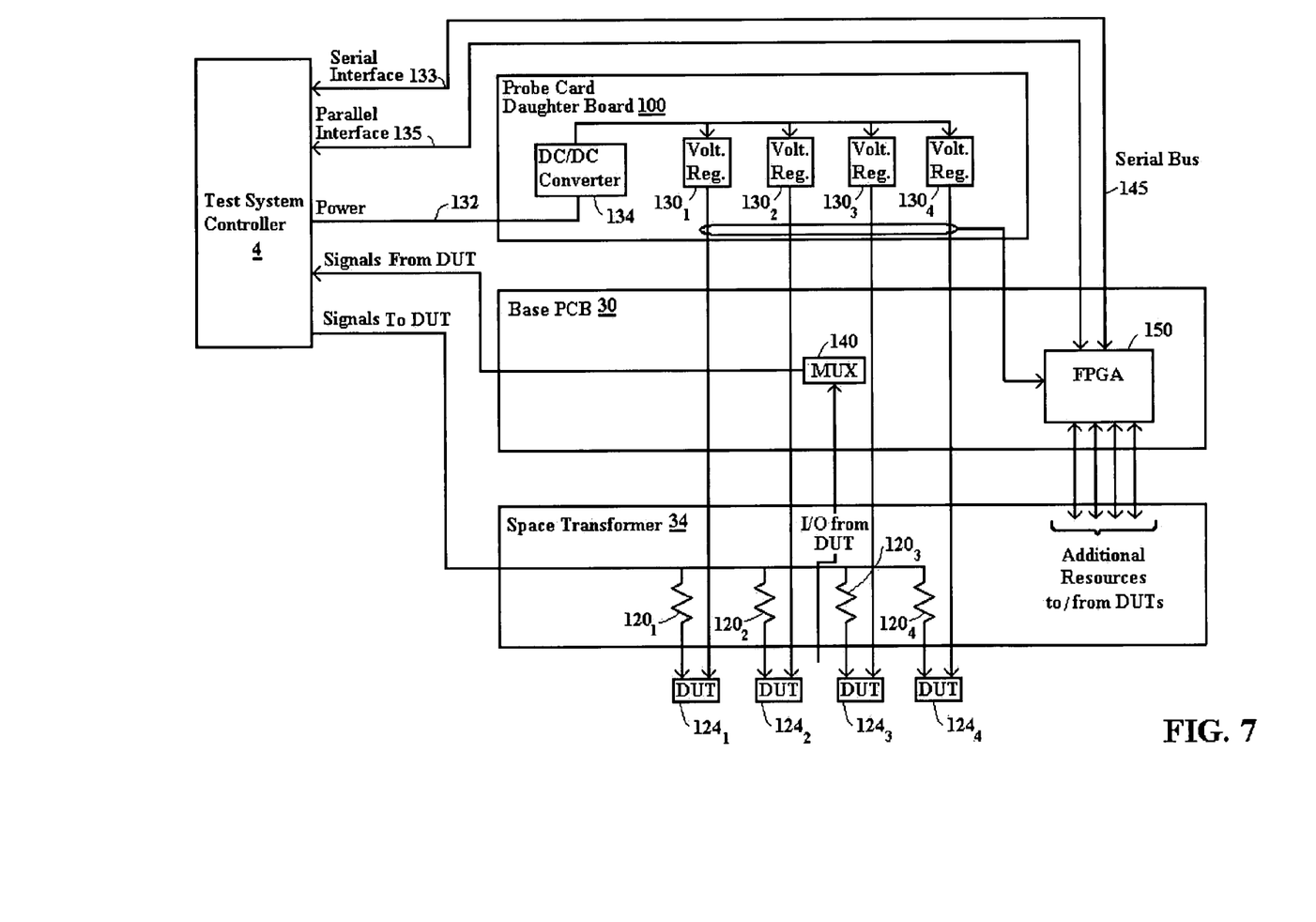
FIG. 7 shows an alternative circuit diagram for components of the probe card of FIG. 5.

FIG. 7 shows an alternative circuit diagram to FIG. 6 for components that may be used on the probe card of FIG. 5. The circuit of FIG. 7 modifies FIG. 6 by using an FPGA 150 to replace the serial-parallel shift register 146, as well as serial DAC 144, and serial ADC 147 on the base PCB 30.

The FPGA 150 can include an on-board micro-controller, or be programmed/configured to provide the function of a micro-controller 110. The micro-controller 110 of FIG. 6 is, thus, shown removed in FIG. 7 with its function assumed by FPGA 150. Similarly, the FPGA 150 of FIG. 7 can be programmed to perform the function of analog multiplexer 142 of FIG. 6. The output of voltage regulators $130_{1-4}$ are, thus, shown in FIG. 7 provided to the FPGA 150 and the analog multiplexer 142 of FIG. 6 is removed in FIG. 7. Other components are carried over from FIG. 6 to FIG. 7, and are similarly labeled.

The FPGA 150 can be programmed or configured by a program such as Verilog. Programming or configuration of the FPGA 150 can be provided prior to installation of the FPGA 150 on the probe card. Programming or configuration of the FPGA 150 can further be performed after installation using the test system controller 4 or other user interface connected to the probe card. The FPGA 150 can be reconfigured based on responses from one or more DUTs to facilitate specific tests required for the DUTs.

Programming of the FPGA may be based on the design database or test bench of the DUT. In one embodiment, the output of a Computer Aided Design (CAD) design system used to develop the DUT may be used to synthesize the test program loaded into the FPGA or micro-controller program memory located on the probe card. The CAD design data base can be used directly or post-processed by design or CAD tools used to design the probe card. In this way, a standard or semi-standard daughter card, base PCB, or space transformer mounted controller assembly may be used and customized by software for testing specific DUT designs.

The FPGA 150 is preferably located on the base PCB 150 to minimize the number of routing lines and connectors between a daughter card 132 and the base PCB 30, although it is conceivable the FPGA 150 could be included on daughter card 100. The FPGA 150 is shown providing a serial interface to serial bus 145 to provide efficient communications with the test system controller 4.

F. Programmable Routing

Signal, power and ground traces in a probe card are described previously as being routed with some type of space transformation, either using the space transformer 34 or base PCB 30. Once these traces are manufactured, there is little flexibility in making changes. Flexibility can be built into probe cards by ICs such as relays, switches, or an FPGA to provide controllable rerouting of the traces. Using a programmable or controllable IC to route signals provides a great degree of flexibility, allowing the same probe card to be used for many designs by simply reprogramming the IC. In one embodiment, the ICs are controlled or programmed from automatic test equipment attached to the probe, allowing test engineers to re-program the probe card in real time as they were debugging a test program.

In one embodiment, the FPGA 150, as shown in FIG. 7, can be configured to provide programmable line routing. The FPGA 150 can function to control routing along with providing a serial-parallel shift function, or function to control trace routing without providing any serial-parallel shifting. Other programmable ICs, such as a PLD or simple programmable switches, can similarly be used to provide the programmable trace routing.

As described previously, connectors 24 distribute signals from the test system controller 4 to connectors 24 of the base PCB 30. Channel transmission lines 40 then distribute signals from the connectors 24 horizontally in the PCB 30 for connection to DUTs. In one embodiment, the channel transmission lines 40 of the PCB are routed through the FPGA 150 on the base PCB 30 to enable routing resources of the test system controller 4 to be programmably connectable to different DUTs. The FPGA 150 simply serves as a programmable switch matrix. In other embodiments, resources from the test system controller 4 are provided either serially or directly to an FPGA 150 on a daughtercard, or on the space transformer 34 to enable programmable connection of test system controller resources to different DUTs. Connection to the FPGA 150 either through the test system controller 4, or through a separate connection from a user interface to the FPGA 150 on the probe card allows the FPGA 150 to be reprogrammed to reconfigure trace routing as desired.

F. Combined Features

The features of an architecture described in sections A-E previously can be used either individually, or combined as test requirements may dictate. A significant increase in the ability to fan out a test signal can be realized with features described according to the present invention. For example, an old generation test system controller might be a 32 DUT test system controller that operates at 33 MHz. Using the intelligent probe card architecture described herein, the test system controller can be expanded to a 256 DUT test system controller operating at the same 33 MHz. If the test system controller has redundancy analysis (RA) capability, multiplexing of the DUT I/O can enable redundancy analysis testing as well. In FIGS. 6 and 7, such ability is shown with DUT I/O inputs provided through a multiplexer 140 to the test system controller 4. The multiplexer can be controlled by micro-controller 110, or the processing unit 146 to route desired DUT I/Os to the test system controller 4.

This shared resource or multiplexed test configuration could be very attractive as a wafer level step-burn-in card, where as indicated previously it is desirable to test all DUTs during one touch down during the burn in process. The test speed might be reduced by multiplexing of DUT I/Os, but in a burn-in situation, this would generally not be limiting. The benefit would be both a wafer level burn-in test system controller solution and possible recovery from burn-in failures with RA either running in the background or provided for in a RA sort after burn in on a separate sort operation.

Although the present invention has been described above with particularity, this was merely to teach one of ordinary skill in the art how to make and use the invention. Many additional modifications will fall within the scope of the invention, as that scope is defined by the following claims.

What is claimed is:

1. A probe card assembly comprising:
   a serial signal interface configured to connect to a test system controller;
   a serial digital to analog converter configured to receive through the serial signal interface digital first test signals in serial from the test system controller, convert the first test signals to parallel, and provide the first test signals to a plurality of first test probes in analog form, wherein the first test probes are configured to contact ones of a plurality of electronic devices under test; and
   a parallel analog to digital converter configured to receive analog response signals in parallel from second test probes configured to contact ones of the electronic devices under test, convert the response signals to serial, and provide the response signals through the serial signal interface in digital form to the test system controller.

2. The probe card assembly of claim 1 comprising:
   a space transformer supporting the first test probes and the second test probes;
   at least one daughter card; and
   a base PCB electrically interconnected with the space transformer and the at least one daughter card, wherein the serial digital to analog converter and the parallel analog to digital converter are each provided on at least one of the space transformer, the base PCB, and the at least one daughter card.

3. The probe card assembly of claim 1 further comprising a parallel signal interface configured to receive in parallel from the test system controller third test signals.

4. The probe card assembly of claim 1 further comprising a signal connection configured to receive a second test signal from the test system controller and distribute the second test signal to a plurality of third test probes, wherein each of the third test probes is configured to contact a different one of the devices under test.

5. The probe card assembly of claim 4 further comprising a switching circuit configured to select for connection to the test system controller any one of a plurality of fourth test probes configured to contact a different one of the devices under test.

* * * * *